United States Patent
Williams et al.

(10) Patent No.: US 8,605,483 B2
(45) Date of Patent: Dec. 10, 2013

(54) MEMRISTIVE DEVICE AND METHODS OF MAKING AND USING THE SAME

(75) Inventors: R. Stanley Williams, Portola Valley, CA (US); Dmitri Borisovich Strukov, Menlo Park, CA (US); Alexandre M. Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 467 days.

(21) Appl. No.: 13/120,905

(22) PCT Filed: Dec. 23, 2008

(86) PCT No.: PCT/US2008/088258
§ 371 (c)(1),
(2), (4) Date: Mar. 24, 2011

(87) PCT Pub. No.: WO2010/074689
PCT Pub. Date: Jul. 1, 2010

(65) Prior Publication Data
US 2011/0182108 A1    Jul. 28, 2011

(51) Int. Cl.
*G11C 11/00* (2006.01)

(52) U.S. Cl.
USPC .......................................... 365/148; 365/151

(58) Field of Classification Search
USPC ................................................ 365/148, 151
See application file for complete search history.

(56) References Cited

U.S. PATENT DOCUMENTS

| | | | | |
|---|---|---|---|---|
| 8,493,138 | B2 * | 7/2013 | Strachan et al. | ............... 327/554 |
| 2002/0163830 | A1 | 11/2002 | Bulovic et al. | |
| 2006/0109708 | A1 | 5/2006 | Pinnow et al. | |
| 2007/0252128 | A1 | 11/2007 | Williams et al. | |
| 2008/0001172 | A1 | 1/2008 | Karg | |
| 2008/0079029 | A1 | 4/2008 | Williams | |
| 2008/0090337 | A1 | 4/2008 | Williams | |
| 2008/0239797 | A1 | 10/2008 | Tsukamoto et al. | |
| 2011/0176353 | A1 * | 7/2011 | Li et al. | ......................... 365/148 |
| 2011/0240941 | A1 * | 10/2011 | Pickett et al. | ..................... 257/1 |

FOREIGN PATENT DOCUMENTS

| | | |
|---|---|---|
| CN | 1574118 A | 2/2005 |
| JP | 2006-173267 | 6/2006 |
| JP | 2008-505499 | 2/2008 |
| JP | 2009-500867 | 1/2009 |
| JP | 2010-506403 | 2/2010 |
| WO | WO-03/094227 | 11/2003 |
| WO | WO-2007/008902 | 1/2007 |
| WO | WO-2007/138646 | 12/2007 |

OTHER PUBLICATIONS

Williams, R.S., "How we found the missing memristor", IEEE Spectrum, Dec. 2008, V45(12), pp. 32-33.
Supplementary European Search Report, EPO (Munich), EP Application No. 08879253, Nov. 9, 2012.
English Translation of Search Report from State Intellectual Property Office of People's Republic China, May 2013.

* cited by examiner

*Primary Examiner* — Tuan T. Nguyen (57) ABSTRACT

A memristive device is disclosed herein. The device includes a first electrode, a second electrode, and an active region disposed between the first and second electrodes. At least two mobile species are present in the active region. Each of the at least two mobile species is configured to define a separate state variable of the memristive device.

15 Claims, 3 Drawing Sheets

MEMRISTIVE DEVICE AND METHODS OF MAKING AND USING THE SAME

BACKGROUND

The present disclosure relates generally to memristive devices, and to methods of making and using the same. Nanometer-scale crossed-wire switching devices have previously been reported that could be switched reversibly and had an ON-to-OFF conductance ratio up to $10^3$. Such devices have been used to construct crossbar circuits and provide a promising route for the creation of ultra-high density non-volatile memory and systems with dynamic/synaptic logic. A latch (which is an important component for logic circuits and for communication between logic and memory) has been fabricated from a series connection of crossed-wire switches. New logic families, constructed entirely from crossbar arrays of switches or as hybrid structures composed of switches and transistors, have also been described. These new logic families have the potential to dramatically increase the computing efficiency of CMOS circuits.

BRIEF DESCRIPTION OF THE DRAWINGS

Features and advantages of embodiments of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

DETAILED DESCRIPTION

Embodiments of the device disclosed herein include an active region located between two electrodes. Contact regions between the metal electrodes and the semiconductor active region form Schottky barriers for current carriers (e.g., electrons or holes). At least two mobile ionic species are introduced into the active region, and such species may be tailored to achieve desirable interface properties (such as, e.g., potential/Schottky barrier heights and/or widths) or desirable bulk properties (such as, e.g., conduction or impurity band transport).

In the embodiments disclosed herein, the at least two species (some of which are ionic) have different mobilities, different concentrations, different charge states, opposite charges, different chemical properties, different physical properties (e.g., activation energy barriers) or combinations thereof. As such, when the species drift and/or diffuse through all or a portion of the active region under an electric field and/or an elevated temperature, the state variable of the device will be altered. It is to be understood that during manufacturing, the devices disclosed herein may be tailored to achieve desirable electrical properties.

In some embodiments, the device disclosed herein is reconfigurable, meaning that it can change its state multiple times via a reversible process. In other words, the devices disclosed herein can be opened and closed multiple times, such as the memory bits in a non-volatile random access memory (RAM). In other embodiments, the device disclosed herein may be singly configurable, meaning that it can change its state once via an irreversible process. Such a switch can be the basis of, for example, a programmable read only memory (PROM). It is to be understood that embodiments of the multi-state variable devices disclosed herein exhibit many different intermediate states, which may be suitable for multi-bit storage.

The devices disclosed herein have many more degrees of freedom defined by a higher dimensional space when compared to the memristors characterized by a single state variable. The increased dimensionality provides an increased set of states, thus providing the device with additional capabilities, for example, logic circuit applications.

In a memristor, the Ohmic law, i.e., the relation between the bias voltage V and the current I (V=R*I), is a non-linear dynamic function of memristance M[q] instead of plain resistance, where q is the charge passed through the memristor. As such, $$V(t)=M[q(t)]*I(t) \qquad (\text{eqn. 1}).$$

Memristance provides a functional relationship between the charge q passed through the device and magnetic flux ($\phi$) conjugated to the bias voltage V, where M=d$\phi$/dq and $\phi$=∫V(t')dt'. The charge q passed over the time t is generally considered the state variable of the memristive device. The present inventors have found that by incorporating multiple mobile species into the memristive device, different state variables $q_1, q_2 \ldots q_n$ may be achieved. In such instances, the following functional relation is realized:

$$V(t)=M[q_1 \ldots q_n]*I \qquad (\text{eqn. 2}),$$

with very different mobilities of the ion species (1 . . . n) involved.

Figure 1A:
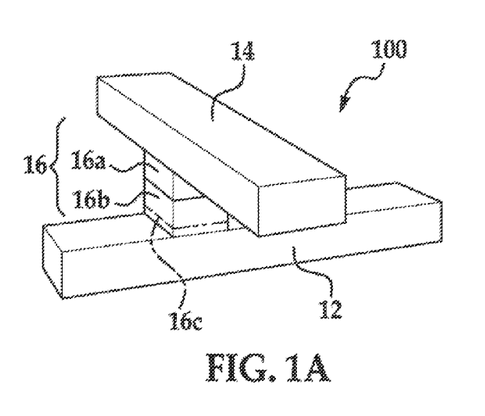
FIG. 1A is a perspective view of an embodiment of a solid-state electrically actuated switch connecting two different crossed wires.
Figure 1B:
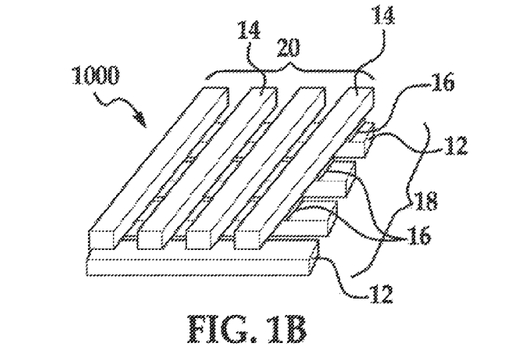
FIG. 1B is a perspective view showing an array of the switches of FIG. 1A, also known as a crossbar.

FIGS. 1A and 1B, respectively, depict a known solid-state electrically actuated switch 100 and a known cross-bar array 1000. In FIG. 1A, two different crossed wires or electrodes 12, 14 have a switch junction 16 therebetween. The switch junction 16 includes a primary active region 16a and a secondary active region 16b. In one embodiment, the primary active region 16a is a material that is both an electronically semiconducting and a weak ionic conductor that can be doped with electron donors as vacancies or substitutional impurities. In another embodiment, the material of the primary active region 16a is both nominally electrically insulating and a weak ionic conductor. The secondary active region 16b is a material that acts as a source and sink of the doping species. As shown in FIG. 1A, the switch junction 16 may also include a molecular layer 16c as a covalently or non-covalently bonded interface, where the molecular layer 16c includes molecules that may or may not be switchable. One or both electrodes 12, 14 may be metal or semiconductor materials. In some instances, both electrodes 12, 14 are metal.

The crossbar array 1000 may also be formed including a plurality of the solid-state electrically actuated switches 10 shown in FIG. 1A. As shown in FIG. 1B, a first layer 18 of approximately parallel electrodes 12 is overlain by a second layer 20 of approximately parallel electrodes 14. The second layer 20 is roughly perpendicular, in orientation, to the electrodes 12 of the first layer 18. It is to be understood, however, that the orientation angle between the layers 18, 20 may vary. The two layers 18, 20 of electrodes 12, 14 form a lattice, or crossbar. Each electrode 14 of the second layer 20 overlies all of the electrodes 12 of the first layer 18, and comes into close contact with each electrode 12 of the first layer 18 at electrode intersections that represent the closest contact between two electrodes 12, 14. The switch junction 16 is shown disposed between electrodes 12, 14 at these contact points. While three such switch junctions 16 are shown, it is to be understood that a switch junction 16 is formed at each intersection of an electrode 12 with an electrode 14. Such crossbars 1000 may be fabricated from micron-, submicron- or nanoscale-wires, depending on the application.

Although individual electrodes 12, 14 in the figures are shown with square or rectangular cross-sections, electrodes 12, 14 may also have circular, elliptical, or more complex cross-sections. The electrodes 12, 14 may also have many different widths or diameters and aspect ratios or eccentricities.

Figure 2:
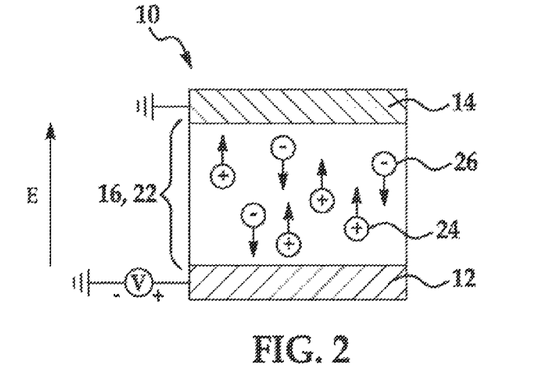
FIG. 2 is a schematic cross-sectional view of an embodiment of the memristive device disclosed herein.

As is well known, such switches 100 may be used as the basis for memories (e.g., the storage of a bit of information, 1 or 0), as either a closed or open switch in a cross-point memory, for configuration bits in a logic circuit that resembles a Field Programmable Gate Array, or as the basis for a wired-logic Programmable Logic Array. These switches 100 also find uses in a wide variety of other applications. The embodiments of the device 10 (see FIGS. 2A and 2B) and 10' (see FIGS. 3A and 3B) disclosed herein are similar to the switch 100.

Referring now to FIG. 2, one embodiment of the memristive device 10 is depicted. As shown, the device 10 includes the first and second electrodes 12, 14 and an active region 22 therebetween. The device 10 may be constructed laterally or vertically. In the example shown in FIG. 2, the device 10 is constructed vertically, and thus the electrodes 12, 14 are bottom and top electrodes, respectively. As previously mentioned, however, the device electrodes 12, 14 may be first and second electrodes within a lateral device.

As non-limiting examples, the bottom electrode 12 may be fabricated using conventional techniques, such as photolithography or electron beam lithography, or by more advanced techniques, such as imprint lithography. In one embodiment, the thickness of the bottom electrode 12 ranges from about 5 nm to about 30 nm. The bottom electrode 12 may be any suitable conductive material, such as gold, platinum, aluminum, silver, tungsten, copper, etc.

As shown in FIG. 2, the active region 22 is established on the bottom electrode 12. The active region 22 functions as a switching junction of the device 10, similar to switching junction 16 briefly described hereinabove. In the embodiments disclosed herein, the active region 22 is capable of transporting and hosting mobile species 24, 26 to control the flow of electrons through the device 10. The basic mode of operation of the device 10 is to apply an electrical field (the drift field, which may exceed some threshold for enabling the motion of one or more of the species 24, 26 in the active region 22) and/or an elevated temperature across the device 10 large enough to cause at least the species 24, 26 with the higher mobility to be transported non-linearly throughout the active region 22 via ionic transport.

In other memristive devices, a single mobile ionic species is utilized in the active region (e.g., oxygen vacancies), and the movement of the mobile species changes the electrical conductivity of the active region from low conductivity (i.e. an undoped semiconductor or insulator—switch-OFF configuration) to high conductivity (doped to provide a higher conductivity—switch-ON configuration) or from high electrical conductivity to low conductivity (switch-ON to switch-OFF). Such abrupt changes exhibit very pronounced hysteresis in I-V curves. In such devices, conceivable mechanisms of the hysteresis involve abrupt changes in internal microstructure of the device, e.g., inhomogeneous changes (e.g., the formation and disappearance of conducting channels), or strong changes at the contact interface. Such changes likely involve the redistribution of the single mobile ionic species inside the device, which results in a change of the electrical resistivity of the device. For example, oxygen vacancies cluster together and form rather conductive areas (e.g., filaments and dendrite filamentary structures) for simplified electron flow.

In the embodiments disclosed herein, the addition of another mobile species to the active region 22 creates a stage (i.e., a particular electrostatic potential) for the movement of the lighter of the two mobile species 24, 26. Generally, there is a considerable difference (e.g., at least about an order of magnitude) between the mobilities of the two mobile species 24, 26. More specifically, the difference in mobility is such that the less mobile species can be reconfigured in a strong enough field, but does not participate in the charge transport that is provided by the more mobile species. Upon device 10 actuation, one or both of the species 24, 26 rearrange within the active region 22, which enables a particular variable state to be achieved. It is to be understood that the properties (e.g., mobilities, concentrations, charge, charge states, etc.) of the two or more different mobile species 24, 26 may be altered in order to control the state variables that may be achieved. It is to be understood that the mobile species 24, 26 will be described further hereinbelow.

The active region 22 is a thin film (e.g., equal to or less than 500 nm) of a material that is electronically semiconducting or nominally electrically insulating and is a weak ionic conductor. It is to be understood that the definition of weak ionic conductor depends upon the application for which the device 10 is designed. The mobility and the diffusion constant for a species in a lattice are directly proportional to one another, via the "Einstein relation." Thus, if the mobility of a species in a lattice is very high, so is the diffusion constant. In general, it is desired for a device 10 to stay in a particular state, ON or OFF, for an amount of time that may range from a fraction of a second to years, depending on the application. Thus, the diffusion constant for such a device 10 is, in an embodiment, low enough to ensure the desired level of stability, to avoid inadvertently turning the device 10 from one I-V regime to another or from ON to OFF (or vice versa) via species 24, 26 diffusion; rather than by intentionally setting the state of the device 10 with a voltage pulse. Therefore, a "weak ionic conductor" is one in which the species mobility, and thus the diffusion constant, is small enough to ensure the stability of the ON or OFF state of the device 10 for as long as necessary under the desired conditions (e.g., the device 10 does not change state because of diffusion of the mobile species 24, 26).

As such, the active region 22 material is selected such that the drift of the mobile species 24, 26 into or out of the active region 22 is possible, but not too facile. This generally ensures that the device 10 will remain in whatever state it is set for a reasonably long time. This also contributes to the device 10 being nonvolatile (i.e., it holds its state after the drift field has been removed). In some instances, the device 10 is a two-terminal device—applying a high bias to the device 10 causes both electron current and ion current to flow, whereas at a low bias the flow of ion current is negligible, which allows the device 10 to hold its resistance state.

Non-limiting examples of suitable materials for the active region 22 include oxides, sulfides, selenides, nitrides, phosphides, arsenides, chlorides, iodides, and bromides of silicon, transition metals, rare earth metals, or alkaline earth metals. It is to be understood, however, that there is a wide range of materials that exhibit the desired combination of properties: electronically semiconducting or insulating and weak ionic conductor to enable the mobile species 24, 26 to be injected by drift into, ejected out of, and/or moved within the active region 22.

In general, any semiconducting material (making up active region 22) that is also a weak ionic conductor with respect to the mobile species 24, 26 that can electrically dope the semiconductor will work in the embodiments disclosed herein. In other words, possible switch compounds for the active region 22 are semiconducting compounds with significant ionic contribution to the bonding. In a non-limiting example, the active region 22 is a material that is undoped and stoichiometric, and the mobile species 24, 26 are a large concentration of anion or cation vacancies and anions or cations contained in a layer of the same or related parent material.

As previously mentioned, in one embodiment, the material for the active region 22 is selected from oxides, sulfides, selenides, nitrides, phosphides, arsenides, chlorides, iodides, and bromides of the transition and rare earth metals, with the alkaline earth metals often being present in compounds. Further, there are various alloys of like compounds with each other, which offer a wide range of compositions if they are mutually soluble in each other. There are also mixed compounds, in which there are two, three or more different metal atoms combined with some number of the electronegative elements.

Materials for the active region 22 including the elements Ti, Zr and Hf are particularly attractive because they may be compatible with Si integrated circuit technology, since the primary oxidation state of all three metals is +4, the same as Si. As such, these elements would not create unintentional doping of the Si. Oxides of these compounds are also known as titania, zirconia, and hafnia, respectively, and also by other names specific to the various polytypes of each. Still another embodiment includes the alloys of these three oxides in pairs or with all three present simultaneously (e.g., $Ti_xZr_yHf_zO_2$, where x+y+z=1). Related sets of compounds include the titanates, zirconates and hafnates, which are represented by the specific example $SrTiO_3$, where Sr is the divalent element strontium. There is a wide variety of such compounds in which Ca, Ba, and other divalent elements (e.g., Mg, Zn, Cd) may be substituted for Sr, and Zr and Hf substituted for Ti. These compounds may be represented as $ABO_3$ compounds, where A is at least one divalent element and B is at least one of Ti, Zr, and Hf, and may have a perovskite structure.

It is also possible to utilize alloys of these various compounds, such as $Ca_aSr_bBa_cTi_xZr_yHf_zO_3$, where a+b+c=1 and x+y+z=1. There is also a wide variety of other oxides of the transition and rare earth metals with different valences that may be used, both individually and as more complex compounds.

Yet another embodiment of compounds suitable for the active region 22 includes the sulfides and selenides of the transition metals with some ionic bonding character, essentially the S and Se analogues of the oxides mentioned above. Still another embodiment of compounds suitable for the active region 20 includes the semiconducting nitrides, such as AlN, GaN, ScN, YN, LaN, rare earth nitrides, and alloys of these compounds and more complex mixed metal nitrides. A still further embodiment of compounds suitable for the active region 22 includes the semiconducting halides (such as CuCl, CuBr, and AgCl), or the phosphides and arsenides of various transition and rare earth metals, e.g., Sc, Y, La, etc.

It is to be further understood that the active region 22 may include sublayers of different materials or compounds chosen from the examples above.

Suitable deposition techniques for the active region 22 include conventional physical and chemical techniques, including evaporation from a heated source, such as a filament or a Knudsen cell, electron beam (i.e., e-beam) from a crucible, sputtering from a target, other forms of evaporation, chemical vapor deposition (CVD), molecular beam epitaxy, atomic layer deposition, or various other forms of chemical vapor or beam growth from reactive precursors. Appropriate deposition or growth conditions, such as speed and temperature, may be selected to achieve the desirable chemical composition and local atomic structure desired for the active region 22.

Prior to device actuation (FIG. 2), the active region 22 includes the at least two mobile species 24, 26. In this state, the species 24, 26 are generally spatially non-uniform. While the active region 22 is depicted as being established between the electrodes 12, 14, it is to be understood that the mobile species 24, 26 may be active/mobile within the entire volume of the active region 22 or just a particular volume (e.g., between one electrode 12, 14 and a tip of an electroformed channel within the active region 22) provided that the species 24, 26 are able to change their spatial distribution under external bias voltage, with or without a particular threshold.

The mobile species 24, 26 may be ionic species (e.g., cations, anions, charged vacancies) or trapped electrons or holes (e.g., trapped in deep mid-gap states of the active region 22). Non-limiting examples of the ionic species include charged oxygen vacancies, chromium ions ($Cr^{2+}$), nickel ions, hydrogen ions, lithium ions, silver ions, beryllium ions, sodium ions, magnesium ions, potassium ions, barium ions, etc. It is to be understood that two different ionic species may be incorporated into the active region 22, or one ionic species may be introduced into the active region 22 having defect-trapped electrons or holes therein. Furthermore, it is to be understood that the species 24, 26 selected will depend, at least in part, on the material selected for the active region 22, and that species 24, 26 other than those listed herein may be utilized. The species 24, 26 shown in FIG. 2 are oppositely charged species having different mobilities.

As mentioned hereinabove, the mobile species 24, 26 selected have different mobilities, different concentrations, different charge states, opposite charges, different chemical properties, or combinations thereof. Such species 24, 26 are selected such that the transport of at least one of the species 24, 26 (in some instances, the slower of the two species 24, 26) throughout the active region 22 is non-linear. Such movement enables unique state variables to be obtained. It is to be understood that, in some embodiments, the device 10 is a binary system in which one of the mobile species 26, 24 (e.g., the faster of the two mobile species) will set a stage for the movement of the other mobile species 24, 26 (e.g., the slower of the two mobile species). In some instances, the mobility of one of the at least two mobile species 26, 24 is generally at least about one order of magnitude greater than the mobility of the other of the at least two mobile species 24, 26. It is to be understood, however, that the mobility of each species 24, 26 depends, at least in part, on the temperature and field applied to the device 10. As set forth in equation 3 hereinbelow, the mobility may be determined using the hopping activation energy of the particular species. For example, the activation energy for Li or Ti interstitial defects in $TiO_{2-x}$ is about 0.4 eV (electron-Volt), and the activation energy for an oxygen vacancy in $TiO_{2-x}$ is about 1.1 eV. Inserting these values into equation 3 below enables the mobility of each species to be calculated. This difference in activation energies in this example translates to a mobility that would be lower by about 12 orders of magnitude for the oxygen vacancies, as compared to the Li or Ti interstitial defects at room temperature.

In one non-limiting example, $Cr^{2+}$ cations may be included with oxygen vacancies in at least a portion of the active region 22. Upon exposure to a predetermined electric field and/or temperature, the oxygen vacancies will move in the field produced by the $Cr^{2+}$ cations. It is to be understood that the concentration profile of the cations may be changed in order to alter the movement of the oxygen vacancies. As such, by configuring the $Cr^{2+}$ cations in the active region 22 containing oxygen vacancies, the I-V characteristics of the device 10 may be controlled. The profile of the $Cr^{2+}$ cations in the active region 22 may then be controlled by an external pulse, thereby switching the device 10 from one I-V regime to another. Since the mobility of the species 24, 26 (in this example, the oxygen vacancies and the $Cr^{2+}$ cations) is vastly different, after the initial movement of the $Cr^{2+}$ cations, such cations would be quite static compared to the oxygen vacancies.

In another non-limiting example, the two species 24, 26 may have similar mobilities, but different concentrations, charge states, chemical properties, or combinations thereof. In such instances, the motion of the species 24, 26 will be coupled, thereby providing a device 10 with two coupled state variables. Non-limiting examples of isoelectronic species 24, 26 having different mobilities include $Ti^{4+}$ and $Li^+$, $Ti^{4+}$ and $Na^+$, $Ti^{4+}$ and $Ba^{2+}$, $Cr^{2+}$ and $Na^+$, or $Be^{2+}$ and $Ba^{2+}$.

In still another non-limiting example, the species 24, 26 have different mobilities and are oppositely charged (as shown in FIG. 2). The motion of these species 24, 26 (e.g., acceptors and donors) will be strongly affected by Coulomb forces that desire an electrically neutral system. In such instances, ambipolar diffusion results, where the effective diffusion coefficient is approximately the diffusion coefficient of the slower of the two species 24, 26. This device 10 may be characterized as having two strongly coupled state variables. FIG. 2, in particular, illustrates oppositely charged species 24, 26 and the direction of motion under an external electric field.

In still another example, the species 24, 26 have the same charge but different mobilities. In one state variable, the species 24, 26 are localized, for example, adjacent to one of the electrodes 12, 14. Upon actuation (i.e., exposure to a predetermined bias voltage for a relatively short time), the faster of the two species 24, 26 drifts toward the other of the electrodes 14, 12, whereby the device 10 is in a second state. In this particular case, it may be suitable to associate the state variable with the mobile species 24, 26 using the concentration profile, rather than the charge (i.e., by specifying at which location in the device 10 most of a particular species 24, 26 reside). For example, if each species 24, 26 has a respective concentration profile of $N_{24}(x, y, z)$ and $N_{26}(x, y, z)$ (where x,y,z, are the spatial coordinates), the state associated with each species may be a centroid of concentration, i.e.:

the state of species 24=vector ($<x>,<y>,<z>$), where $<x>=\int_x N_{24}(x,y,z)dx;$ $<y>=\int_y N_{24}(x,y,z)dy;$ and $<z>=\int_z N_{24}(x,y,z)dz;$ and the state of species 26=vector ($<x>,<y>,<z>$), where $<x>=\int_x N_{26}(x,y,z)dx;$ $<y>=\int_y N_{26}(x,y,z)dy;$ and $<z>=\int_z N_{26}(x,y,z)dz).$ To activate (i.e., move mobile species 26) the device 10 of this example when in the state of species 26, the state of species 24 is forced to some other value. In other cases, it may be suitable to associate the state variable with the mobile species 24, 26 using the concentration in a particular location (e.g., near an interface (between the electrode 12, 14 and the active region 22) within the device 10).

Generally, the active region 22 includes the two or more mobile species 24, 26 without any other dopants. However, in some instances, in addition to the mobile species 24, 26, it may be desirable that the active region 22 also include a background dopant profile. Such a dopant profile is believed to assist in controlling the dynamics of the mobile species 24, 26 and the type of non-linear conductance of the device 10 that is achieved. Such a background dopant profile is generally a fixed, non-uniform dopant. In a non-limiting example, the background dopant profile may be an acceptor dopant (e.g., carbon or nitrogen doping in a $TiO_2$ active region), and the species 24, 26 are donor species, such as hydrogen or lithium anions and negatively charged oxygen vacancies (where the anions have a higher mobility than the oxygen vacancies).

In some embodiments, the background doping may shift the Fermi level, and as a result, the charge state of one or both of the mobile species 24, 26. The charge state may alter the activation energy of ion hopping in a highly non-linear manner. For example, the hopping activation energy for $Ti^{4+}$ and $Ti^{1+}$ interstitial ions in $TiO_{2-x}$ differs by about 0.3 eV, while the mobility depends exponentially on activation energy:

$$\text{mobility} \approx \exp(-U/k_B T) * \exp(aqE/k_B T), \quad \text{(eqn. 3)}$$

where U=activation energy, T=temperature, $k_B$=Boltzmann constant, a=lattice distance, q=elementary charge, and E=net electric field in the material. As such, the mobility of one of the species 24, 26 may be modulated by changing the charge state of that species 24, 26. For example, oxygen vacancies may be charged with one deep and one shallow level. The diffusion activation energy (and hence ion mobility) may be changed from +1 to +2 state. The charge state depends on the local chemical potential, and thus may be increased or decreased via the presence of the other mobile species 26, 24 and/or the background dopant.

In other embodiments, the background doping may change the overall resistivity of the active region 22, which will result in changing the local power dissipation, thereby locally decreasing or increasing the self-heating effect.

According to the equation 3 above, the mobility of the species 24, 26 has a non-linear dependence on temperature. As such, changes in self-heating may affect the species 24, 26 mobility.

Any background dopant that is utilized is deposited or otherwise introduced as the active region 22 is established.

In some instances, the mobile species 24, 26 are introduced into the active region 22 during or after the establishment of the active region 22. In other instances, it may be possible to introduce the mobile species 24, 26 from a separate region (not shown) during device 10 programming. When introduced from a separate region, such introduction may take place either before or after the region 22 has been established on the electrode 12. This depends, at least in part, on the geometry of the device 10 (e.g., whether the active region 22 is below or above the separate region containing the mobile species 24, 26). Some non-limiting examples of techniques suitable for introducing the mobile species 24, 26 to the active region 22 include the following: i) implanting one or both of the mobile species 24, 26 into the active region 22 (during or after its establishment); or ii) diffusing the mobile species 24, 26 from a gaseous source or precursor (during or after establishment of the active region 22); or iii) implanting the mobile species 24, 26 into a region (not shown) adjacent to the established active region 22 and then diffusing the mobile species 24, 26 from the adjacent region. In a non-limiting example, diffusion of the species into the active region 22 may be accomplished via exposure to heat. In another non-limiting example, ion implantation may be carried out, for example, via an ion gun. In still another non-limiting example, when a gaseous source or precursor is utilized, the gas can be ionized before impinging on the active region material.

Once the active region 22 and mobile species 24, 26 are established, the top electrode 14 is established on the active region 22. The top electrode 22 may be the same material as or a different material than the bottom electrode 12, and may be established via the same or a different technique than that used to establish the bottom electrode 12. In one example, the top electrode 14 is evaporated with an electron beam evaporator. The thickness of the top electrode also generally ranges from about 5 nanometers to as many as hundreds of nanometers.

As previously mentioned, the device 10 may be actuated by exposure to a predetermined electric field and/or an elevated temperature. In some instances, the electric field is applied when the temperature is elevated. In other instances, the temperature elevates as a result of current flowing through the device 10 (e.g., self-heating). The electric field and temperature applied will depend, at least in part, on the mobile species 24, 26 selected, their concentrations, their configuration (e.g., state) in the active region 22, and any background profile. As such, external voltages or currents will be selected in light of one or more of the listed factors. The temperature may also depend upon local resistivity, and as a result, upon localized self-heating. In some instances, it may be desirable to apply heat from an external source.

Once the device 10 is actuated, the mobile species 24, 26 having the higher mobility will drift (due to the electric field) and/or diffuse (due to the elevated temperature) within the active region 22 quicker than the mobile species 26, 24 having the lower mobility. Such motion will change the state variable of the device 10. It is to be understood that the other properties (e.g., concentration, charge and/or charge state, chemical properties, etc.) will also define the state variable that is achieved.

It is generally desirable that the transport of the species 24, 26 be non-linear with the electric field or temperature or charge state. Movement of at least one of the species 24, 26 is initiated when the device 10 is exposed to the predetermined electric field. It is to be understood that the electric field may be sufficient to cause the non-linear transport, for example, when $$qEa > k_B T \qquad \text{(eqn. 4)}$$

where T=temperature, $k_B$=Boltzmann constant, a=lattice distance, q=elementary charge, and E=electric field in the material. In some instances, the non-linear movement of the species 24, 26 affects the bulk properties of the device 10 by introducing new states (see, e.g., FIGS. 5A and 5B, discussed hereinbelow) or passivating existing states (see, e.g., FIGS. 6A and 6B, discussed hereinbelow). In other instances, the non-linear movement of the species 24, 26 affects the interface properties (also discussed further hereinbelow).

Figure 3A:
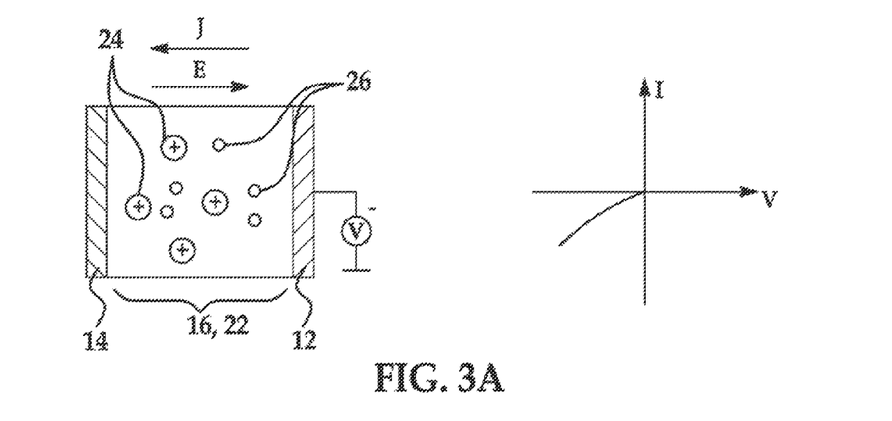
FIGS. 3A through 3C are schematic diagrams of an embodiment of the device and corresponding current-voltage graphs.

FIG. 3A illustrates a non-limiting example of a device 10, and a corresponding voltage (V) vs. current (I) graph of the device 10. In all of the embodiments disclosed herein, it is to be understood that the I-V depends upon the position of the slower of the two species 24, 26.

In the embodiment shown in FIG. 3A, each species 24, 26 may have a respective concentration profile of $N_{24}(x, y, z)$ and $N_{26}(x, y, z)$ (where x,y,z, are the spatial coordinates), and the state associated with each species 24, 26 may be the centroid of concentration. The concentration profiles of the species 24, 26 may also be a step function where there is a relatively constant value and a sharp drop to zero at a specific location, which is one state variable. In this embodiment, the application of the bias voltage will change the position of the state variable.

Figure 3B:
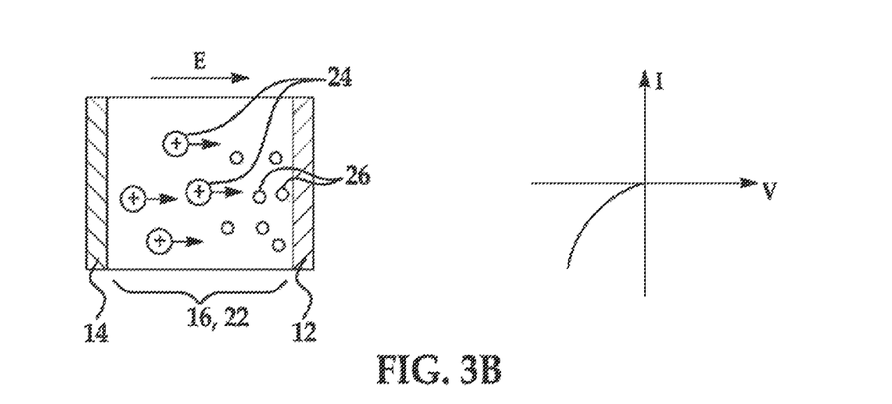

In some instances, when "small" voltages or currents are applied, it is meant that the voltage or current is not enough to initiate the non-linear regime of transport of the slower of the mobile species 24, 26 for a given initial or equilibrium faster mobile species 26, 24 concentration profile. Such small voltages or current are, however, sufficient to move the faster of the mobile species 26, 24. Small changes in fast mobile species 26, 24 concentration profiles will not affect the slow species 24, 26, and once the voltage or current is removed, the faster mobile species 26, 24 will settle in the original state. However, the fast species 26, 24 may be moved far enough throughout the active region 22 to increase the electric field or current or to change the charge state, thereby inducing the non-linear transport of the slower species 24, 26, as shown in FIG. 3B. Once moved, the slower moving mobile species 24, 26 will not change position again unless the device 10 is re-actuated. In such instances, the device 10 may be read with biases smaller than those used to move the faster moving mobile species 26, 24 (a non-limiting example of small biases or currents is shown in the I-V graph of FIG. 3A).

Figure 3C:
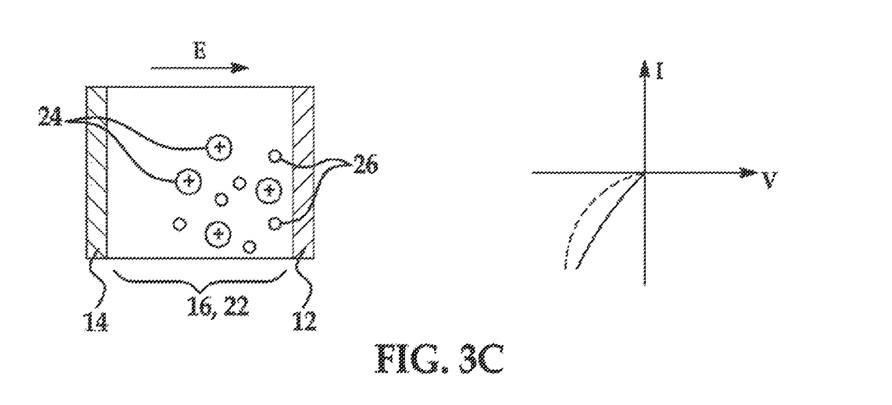

In FIG. 3C, the schematic diagram illustrates the new state (after species 24, 26 movement), and the dashed line in the I-V graph illustrates the I-V curve for the new state.

It is to be understood that the voltages or currents applied will depend, at least in part, on the species 24, 26 and active region 22 selected, the geometry of the conductive channel formed, the thermal properties of the device 10, the thickness of the electrodes 12, 14 and active region 22, any activation barrier of the slower mobile species 24, 26, or the like, or combinations thereof. As non-limiting examples, the small voltage is low enough so as to not cause electric fields exceeding from about 1 to about 5 MV/cm, and the current is low enough so as to not cause Joule heating inside the device 10.

Figure 4A:
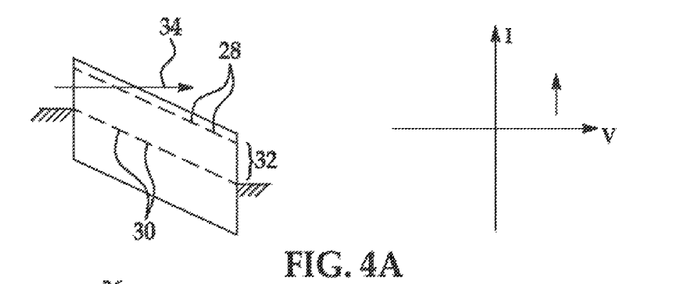
FIGS. 4A and 4B are schematic diagrams of a conduction band undergoing a threshold switching event and corresponding current-voltage graphs.
Figure 4B:
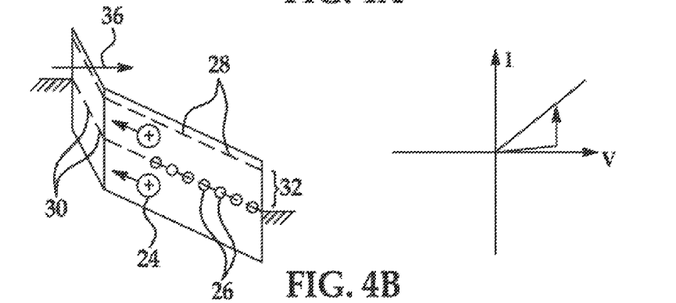
Figure 5A:
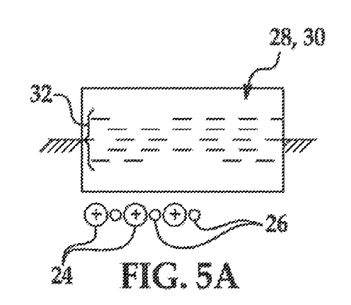
FIGS. 5A and 5B schematically depict an impurity band in an active region of an embodiment of the device before and after actuation, whereby after actuation, new states are created.
Figure 5B:
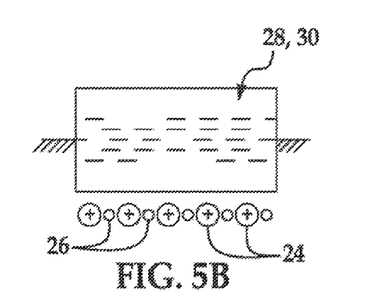

Non-linear movement of the slower of the species 24, 26 may be activated by the drift of the faster of the two species 26, 24 as described above. Non-linear movement may also be achieved via enforcing voltage or current threshold switching. A non-limiting example of such non-linear movement is shown in FIGS. 4A and 4B. In this example, conduction bands 32 are shown before (FIG. 4A) and after (FIG. 4B) a threshold switching event. As shown in FIG. 4B, high electric fields or currents may be reached by filling deep trap levels 30 (referred to hereinbelow as deep level defects) with the faster of the two mobile species 26, 24 (a non-limiting example of which includes electrons). Filling the deep trap levels 30 causes the threshold switching event that enables the slower of the mobile species 24, 26 to subsequently be moved upon exposure to biases that are larger than a voltage threshold, as shown in the graph of FIG. 4B.

It is believed that in one embodiment, a threshold switching event occurs when the injection rate of faster mobile species 26 is greater than its rate of movement inside the device 10. FIG. 4A shows the band diagram with shallow and deep level defects 28, 30, respectively. It is to be understood that in other instances, there may be a continuum of energy states. In this example, the mobility of the faster species 26 (and hence material conductance) will depend on its energy. Upon application of external voltage, the faster species 26 will tunnel through the interface (e.g., a Schottky barrier) into the conduction band 32 at rate R1. If the equilibrium Fermi level in the material 22 is close to the energy of the deep traps 30, the tunneled faster species 26 will relax to the deep traps 30 and slowly move (hop) towards the right electrode (not shown in this Figure) at rate R2. For small biases, R2>R1 and the electrical field is roughly uniform, while device 10 conductance is proportional to the injection rate R1. Upon increasing the bias, rate R1 becomes larger than rate R2, which means that all deep traps 30 will be quickly filled with the faster species 26 (i.e., species 26 are injected with a higher rate than they can be removed), thus lifting the quasi-Fermi level close to shallow energy levels. At the new quasi-Fermi energy, the faster species 26 is very mobile, and the corresponding conductance of the region is very high. Thus, almost all the electric field will be dropped across the Schottky barrier, rendering the barrier lower.

At the point when R1 becomes larger than R2, there will be a sharp rise in current (see the I-V graph of FIG. 4B) and also a sharp rise in the electrical field on the interface between the respective electrode 12, 14 and the active region 22 (see the conductive band of FIG. 4B). Both high current and high field may be used to modulate mobility of the slower ionic mobile species 24 as discussed hereinabove.

The non-linear movement/motion of one or more of the species 24, 26 modulates the electronic conductance of the device 10. In some instances, modulation of the interface properties of the device 10 is desirable. The resistance at one or both interfaces between respective electrodes 12, 14 and the active region 22 may be continuously adjusted via Schottky barrier modulation. In such instances, an interfacial dipole layer (not shown) may be positioned at an interface between the bottom electrode 12 and the active region 22 and/or the top electrode 14 and the active region 22. An interfacial dipole layer may include an interface gap and interface surface states having different shapes of the densities of the states as functions of energy compared to that of the bulk of the active region 22.

When interface states are present, such states may be non-interacting (i.e., defined by the active region 22), or may be interacting (i.e., defined by the electrodes 12, 14 and the active region 22). In other instances, an interface gap may be present with no interface states. The interfacial dipole layer generally renders the barrier height dependent upon the applied voltage.

Figure 6A:
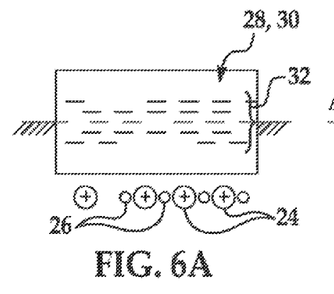
FIGS. 6A and 6B schematically depict an impurity band in an active region of another embodiment of the device before and after actuation, whereby after actuation, existing states are passivated.
Figure 6B:
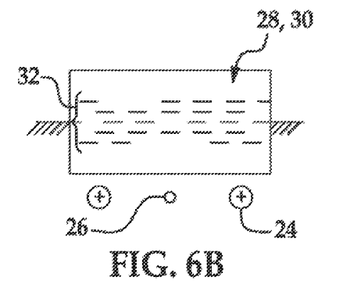

In other instances, the bulk properties of the device 10 may be modulated by compensating for any background fixed doping via the addition of a shallow mobile species 24, 26, or by incorporating deep-level mobile species 24, 26 which are capable of modulating the impurity band. As used herein, the shallow energy level of a shallow mobile species is close to the conduction (or valence) band, i.e. with its energy difference less than $k_B T$ (Boltzmann constant times temperature) with respect to conduction band edge. Also as used herein, the deep energy level of a deep-level mobile species is the opposite of shallow level, i.e. the energy difference is much larger than $k_B T$. As shown schematically in FIGS. 5A and 5B, the deep-level mobile species 24, 26 may create new states within the impurity band after device 10 actuation. For example, metal ions, such as $Ni^+$, $Li^+$ may, in some instances, introduce new deep electron energy states as they move within the active material 22. As shown in FIGS. 6A and 6B, the deep-level mobile species 24, 26 may passivate existing states within the impurity band after device 10 actuation. For example, hydrogen ions, which are typically very mobile, tend to passivate dangling bonds in silicon.

While not shown in FIG. 2, it is to be understood that either of the electrodes 12, 14 may be established on a substrate. Generally, when the substrate is utilized, it is an insulating substrate, such as silicon dioxide, silicon nitride, magnesium oxide, strontium titanate, glass, or the like.

Also while not shown in FIG. 2, it is to be understood that an adhesion layer may be established between a substrate and the top or bottom electrodes 12, 14 adjacent such substrate. Generally, such an adhesion layer enhances the bond between the substrate and the subsequently established adjacent electrode 12, 14. In some instances, the adhesion layer may be a source of at least one of the mobile species 24, 26 for the active region 22, which diffuse through the adjacent electrode 12, 14 when exposed to certain conditions. Non-limiting examples, which are believed to be suitable materials for the adhesion layer, include titanium, chromium, aluminum, magnesium, zinc, niobium, tantalum, manganese, vanadium, zirconium, ruthenium, or hafnium. When utilized, the adhesion layer may be established on the substrate or electrode 12, 14 via any suitable technique, such as, for example, sputtering, e-beam evaporation, molecular beam epitaxy, chemical vapor deposition (CVD), or atomic layer deposition (ALD). It is to be understood, as shown in the embodiment of FIG. 2, that the adhesion layer may be omitted if desirable. It is to be further understood that when the layer is used solely as a source of the mobile species 24, 26, such layer may be positioned adjacent to any electrode 12, 14 (or adjacent to a side electrode, not shown).

Clause 1: A memristive device, comprising:
 a first electrode;
 a second electrode;
 an active region disposed between the first and second electrodes; and
 at least two mobile species present in the active region, each of the at least two mobile species configured to define a separate state variable of the memristive device.

Clause 2: The memrisitive device as defined in clause 1 wherein the at least two mobile species are each an ionic species, or wherein one of the at least two mobile species is an ionic species and an other of the at least two mobile species is a mobile trapped electron or hole.

Clause 3: The memristive device as defined in any of the preceding clauses wherein the at least two mobile species have different concentrations, different mobilities, different charge states, opposite charges, different chemical properties, or combinations thereof.

Clause 4: The memristive device as defined in clause 3 wherein the at least two mobile species have different mobilities, and wherein the mobility of one of the at least two mobile species is at least one order of magnitude greater than the mobility of an other of the at least two mobile species.

Clause 5: The memristive device as defined in any of the preceding clauses wherein the active region has a background doping profile that controls dynamics of the at least two mobile species.

Clause 6: The memristive device as defined in clause 5 wherein the background doping profile of the active region is static.

Clause 7: The memristive device as defined in any of the preceding clauses wherein the at least two mobile species are each independently selected from charged vacancies, anions, cations, electrons, and holes.

Clause 8: The memristive device as defined in any of the preceding clauses, further comprising an interfacial dipole layer positioned at an interface between i) the second electrode and the active region, ii) the first electrode and the active region, or ii) both i and ii.

Clause 9: The memristive device as defined in any of the preceding clauses wherein the at least two mobile species drift through the active region at different rates when exposed to a predetermined electric field.

Clause 10: The memristive device as defined in any of the preceding clauses wherein the device is reversible under a predetermined electric field.

Clause 11: A method for using the memristive device as defined in any of the preceding clauses, the method comprising:
   exposing the active region to a predetermined electric field, thereby causing the at least two mobile species to drift trough the active region at different rates to form a different state variable than a state variable of the device prior to such exposure.

Clause 12: The method as defined in clause 10 wherein the predetermined electric field has a low voltage and small current, wherein exposing causes one of the at least two mobile species to move at a different mobility rate than an other of the at least two mobile species, and wherein the method further comprises:
   removing the predetermined electric field, thereby causing the one of the at least two mobile species to move back to an equilibrium state.

Clause 13: A method for making a memristive device as defined in any of clauses 1 through 10, the method comprising:
   introducing the at least two mobile species to the active region; and
   exposing the active region to at least one of an electric field or an elevated temperature, thereby causing the at least two mobile species to drift through an additional portion of the active region at different rates and changing a state variable of the memristive device.

Clause 14: The method as defined in clause 13 wherein the drift of the at least two mobile species introduces a new state or passivates an existing state.

Clause 15: The method as defined in any of clauses 13 or 14 wherein prior to exposing, the method further comprises:
   establishing the active region between the first and second electrodes; and
   introducing the at least two mobile species simultaneously with establishing the active region or after establishing the active region, wherein introducing the at least two mobile species is independently accomplished by i) implanting at least one of the at least two mobile species into the active region or a region directly or indirectly adjacent thereto; or ii) diffusing at least one of the at least two mobile species from a gaseous source or precursor into the active region or a region directly or indirectly adjacent thereto; or iii) implanting at least one of the at least two mobile species into a region adjacent to the established active region and then diffusing the at least one of the first or second dopants from the adjacent region.

While several embodiments have been described in detail, it will be apparent to those skilled in the art that the disclosed embodiments may be modified. Therefore, the foregoing description is to be considered exemplary rather than limiting.

What is claimed is:

1. A memristive device, comprising:
   a first electrode;
   a second electrode;
   an active region disposed between the first and second electrodes; and
   at least two mobile species present in the active region, each of the at least two mobile species configured to define a separate state variable of the memristive device.

2. The memrisitive device as defined in claim 1 wherein the at least two mobile species are each an ionic species, or wherein one of the at least two mobile species is an ionic species and an other of the at least two mobile species is a mobile trapped electron or hole.

3. The memristive device as defined in claim 1 wherein the at least two mobile species have different concentrations, different mobilities, different charge states, opposite charges, different chemical properties, or combinations thereof.

4. The memristive device as defined in claim 3 wherein the at least two mobile species have different mobilities, and wherein the mobility of one of the at least two mobile species is at least one order of magnitude greater than the mobility of an other of the at least two mobile species.

5. The memristive device as defined in claim 1 wherein the active region has a background doping profile that controls dynamics of the at least two mobile species.

6. The memristive device as defined in claim 5 wherein the background doping profile of the active region is static.

7. The memristive device as defined in claim 1 wherein the at least two mobile species are each independently selected from charged vacancies, anions, cations, electrons, and holes.

8. The memristive device as defined in claim 1, further comprising an interfacial dipole layer positioned at an interface between i) the second electrode and the active region, ii) the first electrode and the active region, or ii) both i and ii.

9. The memristive device as defined in claim 1 wherein the at least two mobile species drift through the active region at different rates when exposed to a predetermined electric field.

10. The memristive device as defined in claim 1 wherein the device is reversible under a predetermined electric field.

11. A method for using the memristive device as defined in claim 1, the method comprising:
   exposing the active region to a predetermined electric field, thereby causing the at least two mobile species to drift trough the active region at different rates to form a different state variable than a state variable of the device prior to such exposure.

12. The method as defined in claim 10 wherein the predetermined electric field has a low voltage and small current, wherein exposing causes one of the at least two mobile species to move at a different mobility rate than an other of the at least two mobile species, and wherein the method further comprises:
   removing the predetermined electric field, thereby causing the one of the at least two mobile species to move back to an equilibrium state.

13. A method for making a memristive device as defined in claim 1, the method comprising:
- introducing the at least two mobile species to the active region; and
- exposing the active region to at least one of an electric field or an elevated temperature, thereby causing the at least two mobile species to drift through an additional portion of the active region at different rates and changing a state variable of the memristive device.

14. The method as defined in claim 13 wherein the drift of the at least two mobile species introduces a new state or passivates an existing state.

15. The method as defined in claim 13 wherein prior to exposing, the method further comprises:
- establishing the active region between the first and second electrodes; and
- introducing the at least two mobile species simultaneously with establishing the active region or after establishing the active region, wherein introducing the at least two mobile species is independently accomplished by i) implanting at least one of the at least two mobile species into the active region or a region directly or indirectly adjacent thereto; or ii) diffusing at least one of the at least two mobile species from a gaseous source or precursor into the active region or a region directly or indirectly adjacent thereto; or iii) implanting at least one of the at least two mobile species into a region adjacent to the established active region and then diffusing the at least one of the first or second dopants from the adjacent region.

* * * * *

UNITED STATES PATENT AND TRADEMARK OFFICE
CERTIFICATE OF CORRECTION

PATENT NO. : 8,605,483 B2  
APPLICATION NO. : 13/120905  
DATED : December 10, 2013  
INVENTOR(S) : R. Stanley Williams et al.

Page 1 of 1

It is certified that error appears in the above-identified patent and that said Letters Patent is hereby corrected as shown below:

In the Claims

Column 14, line 21, in Claim 2, delete "memrisitive" and insert -- memristive --, therefor.

Column 14, line 46, in Claim 8, delete "ii)" and insert -- iii) --, therefor.

Column 14, line 56, in Claim 11, delete "trough" and insert -- through --, therefor.

Signed and Sealed this
Twentieth Day of May, 2014

Michelle K. Lee
*Deputy Director of the United States Patent and Trademark Office*